(12) United States Patent
Matsubara

(10) Patent No.: US 7,977,990 B2
(45) Date of Patent: Jul. 12, 2011

(54) DUTY CORRECTION CIRCUIT, DUTY CORRECTION SYSTEM, AND DUTY CORRECTION METHOD

(75) Inventor: Satoshi Matsubara, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 41 days.

(21) Appl. No.: 12/626,315

(22) Filed: Nov. 25, 2009

(65) Prior Publication Data

US 2010/0127744 A1 May 27, 2010

(30) Foreign Application Priority Data

Nov. 27, 2008 (JP) ................................ 2008-302295

(51) Int. Cl.
*H03K 3/017* (2006.01)
(52) U.S. Cl. ........................................ 327/175; 327/172
(58) Field of Classification Search ........... 327/172–175
See application file for complete search history.

(56) References Cited

U.S. PATENT DOCUMENTS

| 5,945,857 | A | 8/1999 | Havens | |
|---|---|---|---|---|
| 6,967,514 | B2 * | 11/2005 | Kizer et al. | 327/175 |
| 7,015,739 | B2 * | 3/2006 | Lee et al. | 327/175 |
| 7,612,593 | B2 * | 11/2009 | Kim et al. | 327/175 |
| 2003/0111705 | A1 | 6/2003 | Seo | |
| 2003/0204767 | A1 | 10/2003 | Ishida et al. | |
| 2006/0114042 | A1 | 6/2006 | Lee et al. | |
| 2007/0285147 | A1 | 12/2007 | Sakai | |

FOREIGN PATENT DOCUMENTS

| JP | 2-131615 A | 5/1990 |
|---|---|---|
| JP | 2003-198343 A | 7/2003 |
| JP | 2003-318705 A | 11/2003 |
| JP | 2006-157909 A | 6/2006 |
| JP | 2007-329924 A | 12/2007 |

OTHER PUBLICATIONS

William J. Dally et al; "Digital Systems Engineering"; ISBN 0-521-59292-5; 1998; pp. 606-607.

* cited by examiner

*Primary Examiner* — An T Luu
(74) *Attorney, Agent, or Firm* — Arent Foxx LLP

(57) ABSTRACT

A duty correction circuit is provided which includes a level shifter receives complementary differential input signals having a duty ratio and controls levels of the differential input signals; a TrTf control circuit receives output signals of the level shifter and controls edge angles of the output signals; a waveform shaping circuit receives output signals of the TrTf control circuit and shapes waveforms of the output signals; a first common mode comparator extracts common modes of the output signals of the TrTf control circuit and compares the common modes; and a second common mode comparator extracts common modes of output signals of the waveform shaping circuit and compares the common modes. The level shifter controls the levels based on outputs of the first common mode comparator and the TrTf control circuit controls the edge angles based on outputs of the second common mode comparator.

14 Claims, 14 Drawing Sheets

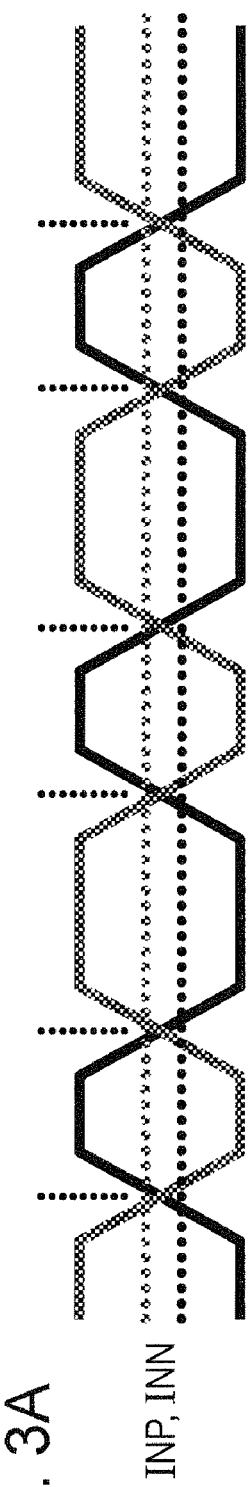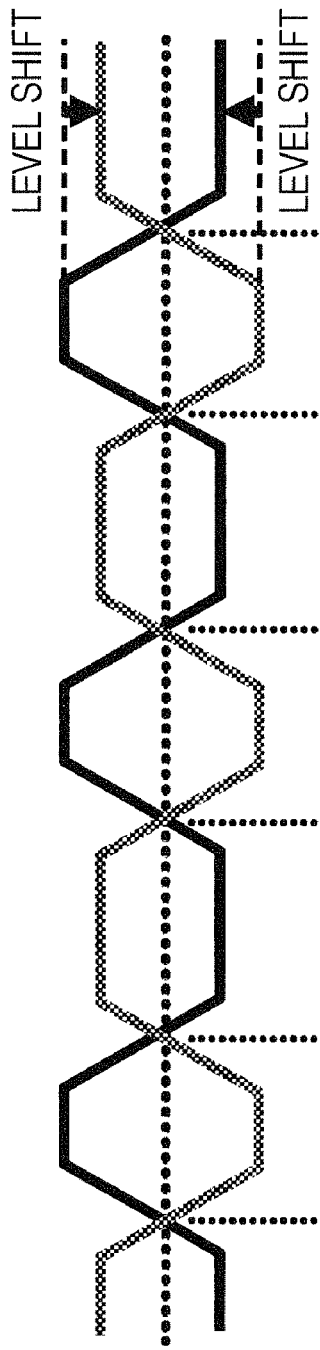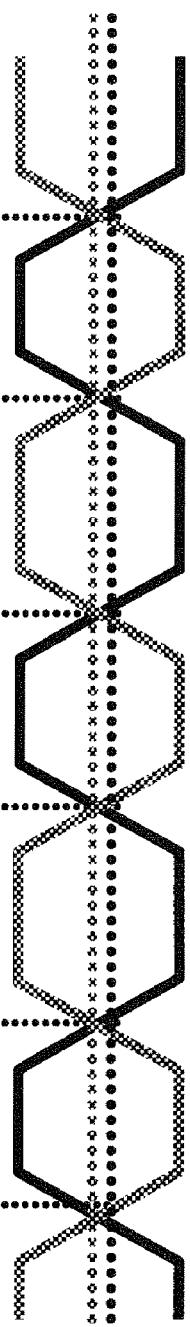
FIG. 3A INP, INN
FIG. 3B N1P, N1N
FIG. 3C OUTP, OUTN

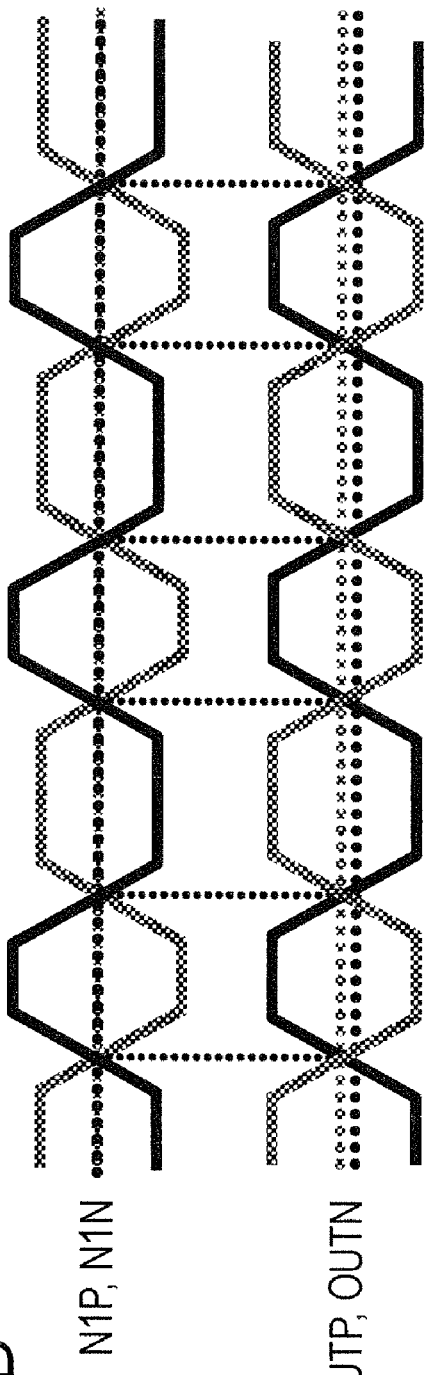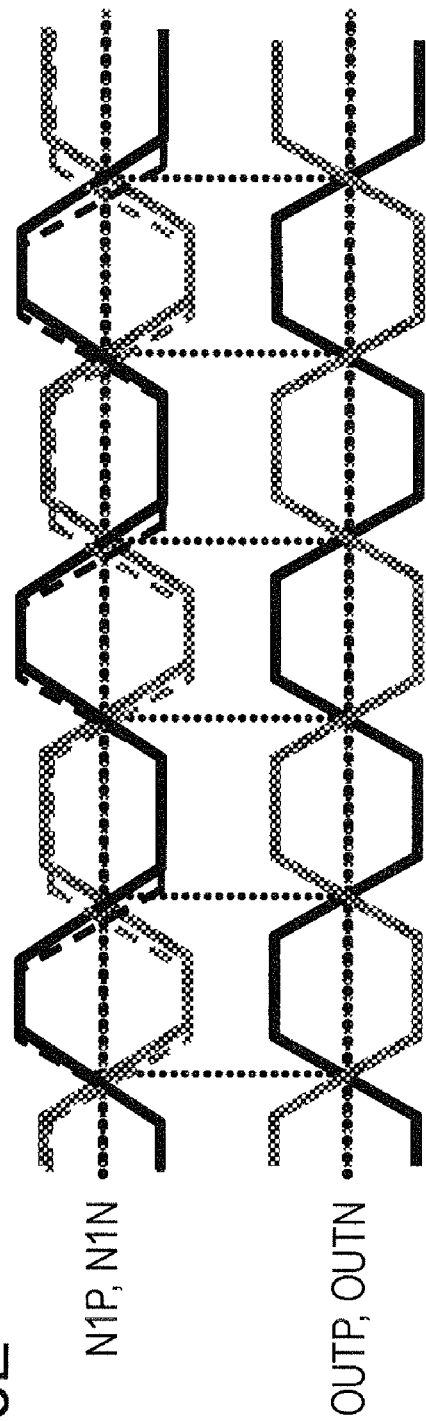

DUTY CORRECTION CIRCUIT, DUTY CORRECTION SYSTEM, AND DUTY CORRECTION METHOD

CROSS-REFERENCE TO RELATED APPLICATIONS

This application claims the benefit of priority from Japanese Patent Application No. 2008-302295 filed on Nov. 27, 2008, the entire contents of which are incorporated herein by reference.

BACKGROUND

1. Field

An embodiment discussed herein relates to correction of a duty ratio of a reference signal used for transmission inside or outside a large-scale integrated (LSI) chip.

2. Description of Related Art

Operating frequencies of components of information processing devices have increased, such as operation frequencies of computers, static RAMs (SRAMs), dynamic RAMs (DRAMs), processors, or LSIs for switches. Hence, an increase in signal transmission speed, for example, an increase in transmission capacity measured by bit per second (bps) and a decrease in transmission delay are desired.

A communication backbone device etc. may desirably have a high data rate for signal transmission/reception. As the amount of information for transmission/reception increases, the number of I/O channels on systems, substrates or chips increases.

A digital circuit performs data transfer in synchronization with a reference signal such as a clock signal. Accordingly, a circuit is designed so that a reference clock satisfies the strictest condition.

Related arts are disclosed in, for example, U.S. Pat. Nos. 7,015,739, 5,945,857, Japanese Laid-open Patent Publication No. 2007-329924, or the document of Digital Systems Engineering, William J. Dally, ISBN 0-521-59292-5, P606-607.

SUMMARY

According to one aspect of the embodiments, a duty correction circuit is provided which includes a level shifter which receives complementary differential input signals having a duty ratio and controls levels of the differential input signals; a rise time fall time (TrTf) control circuit which receives output signals of the level shifter and controls edge angles of the output signals; a waveform shaping circuit which receives output signals of the TrTf control circuit and shapes waveforms of the output signals; a first common mode comparator which extracts common modes of the output signals of the TrTf control circuit and compares the common modes with each other; and a second common mode comparator which extracts common modes of output signals of the waveform shaping circuit and compares the common modes with each other. The level shifter controls the levels based on outputs of the first common mode comparator and the TrTf control circuit controls the edge angles based on outputs of the second common mode comparator.

Additional advantages and novel features of the invention will be set forth in part in the description that follows, and in part will become more apparent to those skilled in the art upon examination of the following or upon learning by practice of the invention.

BRIEF DESCRIPTION OF THE DRAWINGS

FIGS. 3A through 3E illustrate an exemplary loop operation of a duty correction circuit.

DESCRIPTION OF EMBODIMENTS

When a CMOS process is miniaturized, relative variations in transistor elements and resistance elements may increase. During transmission of a small-amplitude high-speed clock signal, which is likely affected by variations in elements, a duty ratio of a clock signal is distorted because of a slight change of an element characteristic. As a result of the distorted duty ratio of the clock signal, a timing margin for data transmission/reception decreases, and as such an error rate increases.

For example, when small-amplitude clock transmission operable with about 10 GHz is performed, a device of 65-nm CMOS uses a small-amplitude differential amplifier circuit and a duty correction circuit providing automatic feedback for a clock signal.

Figure 1:
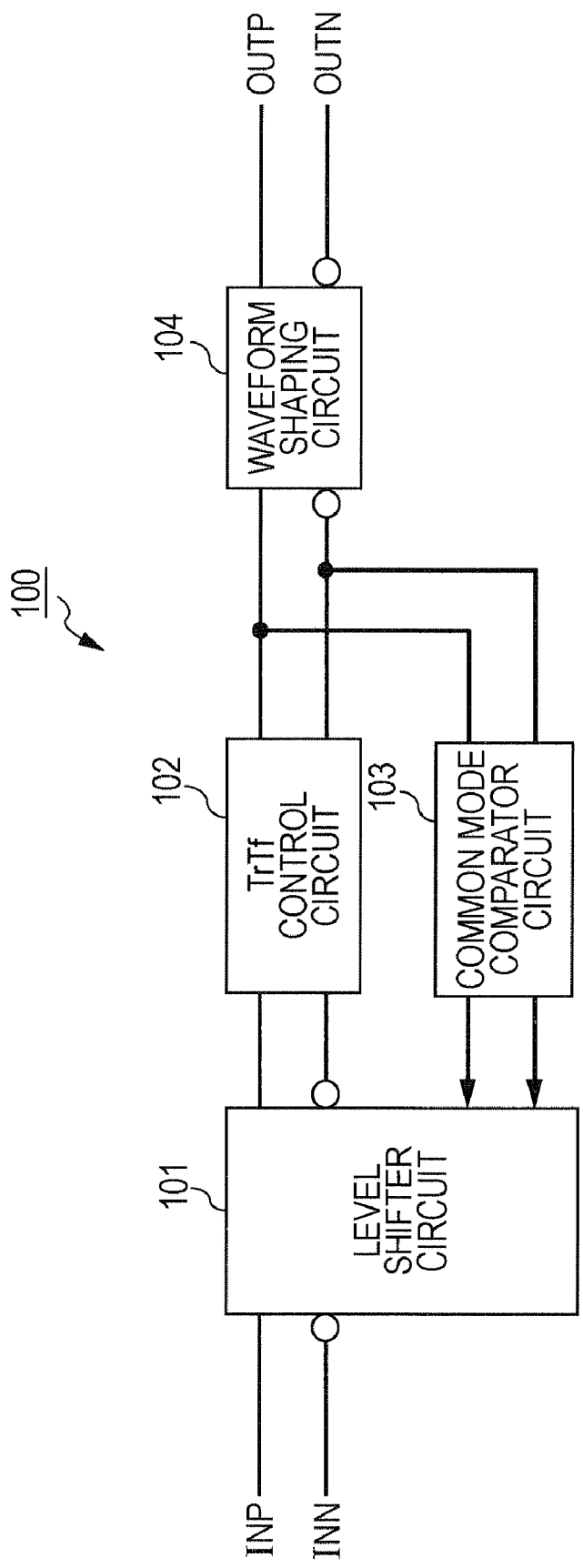
FIG. 1 illustrates an exemplary duty correction circuit.

FIG. 1 illustrates an exemplary duty correction circuit. A duty correction circuit 100 includes a level shifter circuit 101, a TrTf control circuit 102, a common mode comparator circuit 103, and a waveform shaping circuit 104.

In the duty correction circuit 100, a signal INP and a signal INN whose phase is shifted from a phase of the signal INP by 180 degrees are input to the level shifter circuit 101. The level shifter circuit 101 adjusts a common mode of each input signal by adjusting an offset which corresponds to DC component of the input signal. For example, the common modes of the signals INP and INN are adjusted based on outputs from the common mode comparator circuit 103. The TrTf control circuit 102 controls a duty ratio by adjusting an edge angle, for example, a rise time (Tr) or a fall time (Tf) of each of two output signals of the level shifter circuit 101. Differential signals output from the TrTf control circuit 102 are input to the waveform shaping circuit 104. The waveform shaping circuit 104 corrects amplitudes of the differential signals. The differential signals output from the TrTf control circuit 102 are input to the common mode comparator circuit 103. The common mode comparator circuit 103 compares the differential signals having the common modes shifted by the TrTf control circuit 102, and outputs the comparison result as a feedback to the level shifter circuit 101.

Figure 2:
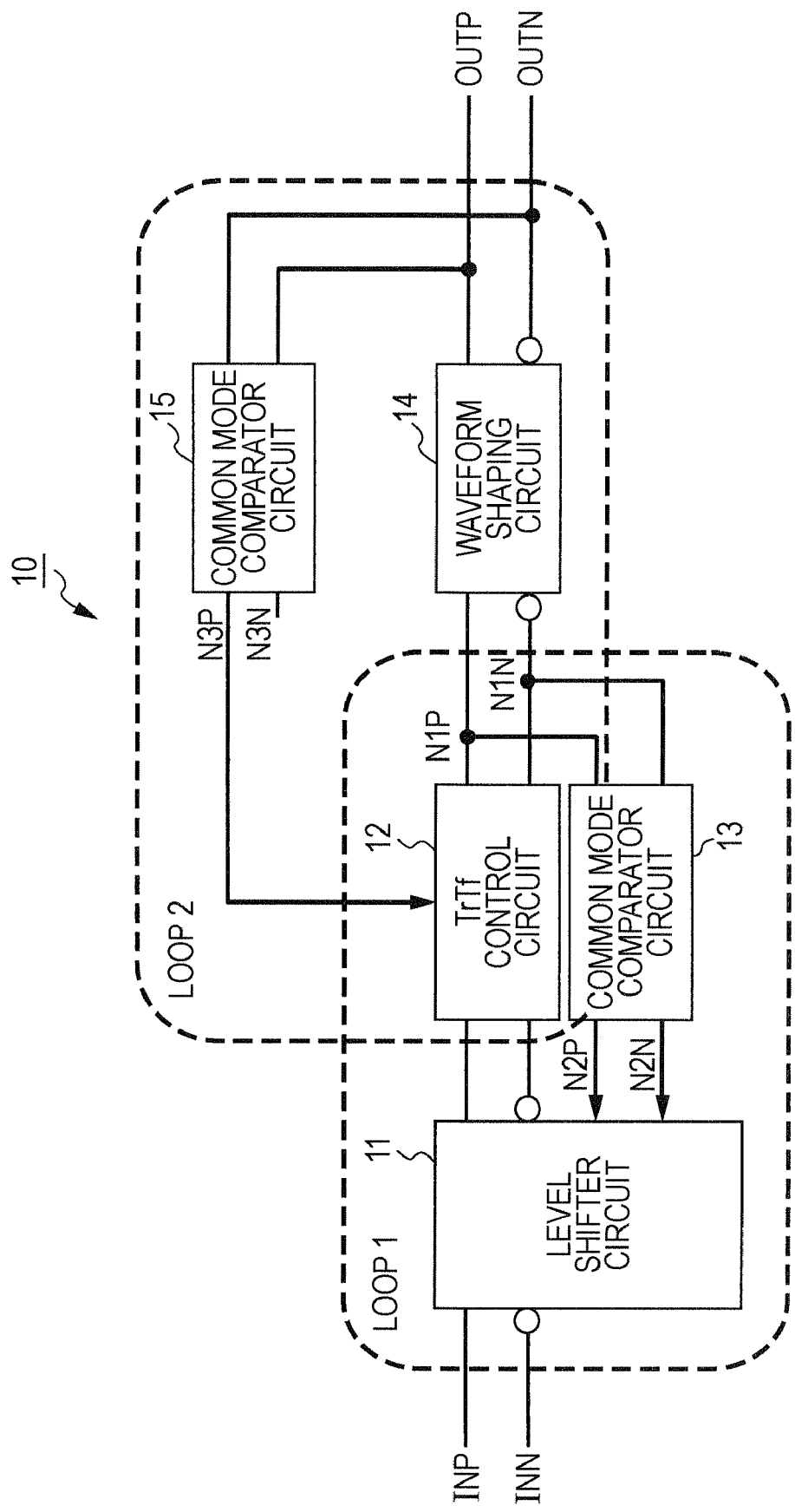
FIG. 2 illustrates an exemplary duty correction circuit.

FIG. 2 illustrates an exemplary duty correction circuit. Similarly to the duty correction circuit 100 in FIG. 1, a duty correction circuit 10 includes a level shifter circuit 11, a TrTf control circuit 12, and a common mode comparator circuit 13. The level shifter circuit 11 changes offset values of signals INP and INN for correction of a duty ratio. The TrTf control circuit 12 changes edge angles of output signals of the level shifter circuit 11 and corrects a duty ratio of the output signals to 50%. The common mode comparator circuit 13 extracts offsets from differential signals output from the TrTf control circuit 12, compares the offsets with each other, and feeds back the comparison result to the level shifter circuit 11. The level shifter circuit 11 changes the offset values based on the feedback. A feedback loop coupling the level shifter circuit 11, the TrTf control circuit 12, the common mode comparator circuit 13, and then the level shifter circuit 11 in that order, defines as a loop 1.

The duty correction circuit 10 includes a loop 2. In the loop 2, offsets are extracted from output signals of a waveform shaping circuit 14, the offsets are compared, and the comparison result is fed back to the TrTf control circuit 12.

The duty correction circuit 10 includes the loop 1 for providing feedback to align the common modes of the differential signals in the circuit with each other, and the loop 2 for adjusting Tr or Tf of the input signals such that the common modes are aligned with each other between output signals OUTP and OUTN. In the loop 1, common modes of output signals N1P and N2P of the TrTf control circuit 12 are detected, feedback is performed to align the common modes with each other, and a duty ratio of N1P/N1N is corrected. In the loop 2, feedback is provided to the TrTf control circuit 12 to align common modes of output signals OUTP and OUTN of the waveform shaping circuit 14 with each other. Accordingly, a duty ratio between the output signals OUTP and OUTN is corrected to 50%.

The duty correction circuit 10 corrects the duty ratio between the output signals OUTP and OUTN to 50% regardless of Tr or Tf of the input signals INP and INN being variable depending on a frequency of input signals, a supply voltage, a temperature, or a process condition.

FIG. 3 illustrates an exemplary loop operation of a duty correction circuit. Since a duty ratio between input signals INP and INN illustrated in FIG. 3A is shifted by 50%, the common modes of the signals may be shifted from each other. When the input signals are input to the duty correction circuit 10, a level shift is performed, that is, the level shifter circuit 11 and the TrTf control circuit 12 change offset values to align the common modes with each other. Accordingly, the input signals are corrected to input signals N1P and N1N whose common modes are aligned with each other as illustrated in FIG. 3B. For example, common modes of output signals OUTP and OUTN generated by waveform shaping of the waveform shaping circuit 14 based on the feedback correction in the loop 1 may be shifted from each other as illustrated in FIG. 3C depending on a frequency of input signals, a supply voltage, a temperature, or a process condition.

FIG. 3D illustrates an exemplary feedback correction of a loop 1. FIG. 3E illustrates an exemplary feedback correction of loops 1 and 2. The TrTf control circuit 12 outputs the differential signals N1P and N1N. The waveform shaping circuit 14 outputs the output signals OUTP and OUTN.

In the feedback illustrated in FIG. 3D, the duty ratio is not corrected to 50% even after the loop 1 becomes stable. Hence, the common modes of the output signals OUTP and OUTN after the waveform shaping by the waveform shaping circuit 14 may not be aligned with each other.

In the feedback illustrated in FIG. 3E, the common mode comparator circuit 15 compares the common modes with each other between the output signals OUTP and OUTN after the waveform shaping by the waveform shaping circuit 14. The comparison result is fed back to the TrTf control circuit 12, and hence, the duty correction is optimized, and the duty ratio between the output signals OUTP and OUTN of the duty correction circuit 10 is corrected to 50%.

Figure 4A:
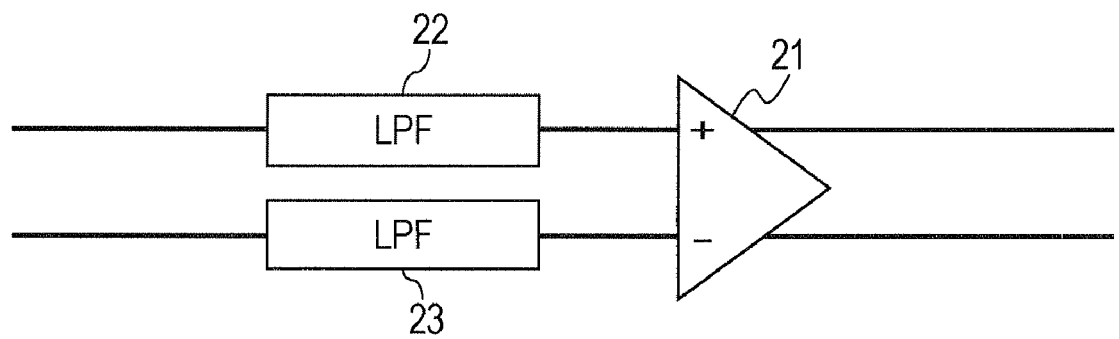
FIGS. 4A and 4B illustrate an exemplary common mode comparator circuit.

FIG. 4 illustrates an exemplary common mode comparator circuit. The common mode comparator circuit illustrated in FIG. 4 may be either the common mode comparator circuit 13 and 15 illustrated in FIG. 2. The common mode comparator circuit in FIG. 4A includes low pass filters (LPFs) 22 and 23 respectively at two inputs of a comparator 21.

Signals N1P and N1N output from the TrTf control circuit 12, or signals OUTP and OUTN output from the waveform shaping circuit 14 are input to the inputs of the low pass filters 22 and 23. The output from the comparator 21 is input as a feedback to the level shifter circuit 11 or the TrTf control circuit 12.

The comparator 21 in FIG. 4A includes two inverse outputs. When a value of an input terminal '+' is larger than a value of an input terminal '−', the comparator 21 outputs '1' and '0'. When a value of the input terminal '−' is larger than a value of the input terminal '+', the comparator 21 outputs '0' and '1'.

Figure 4B:
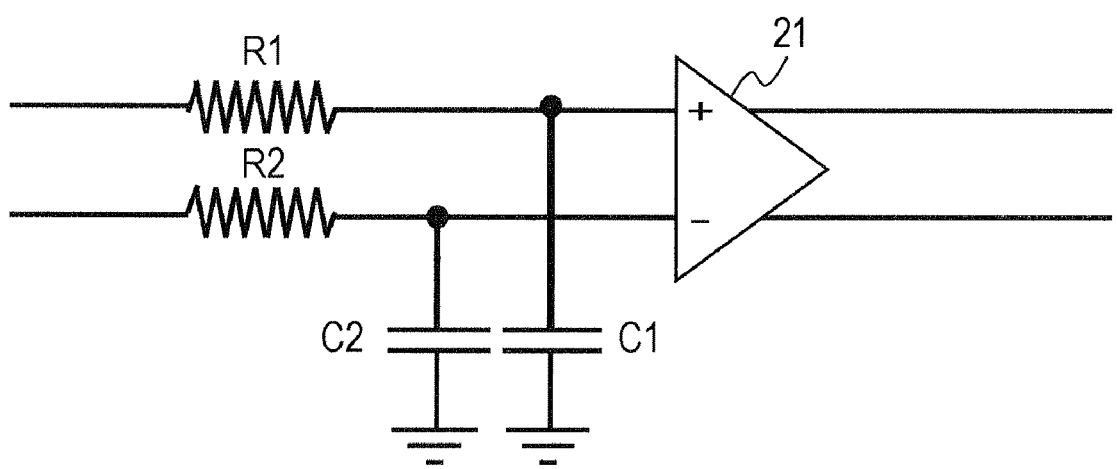

The common mode comparator circuit illustrated in FIG. 4B includes resistors R1 and R2 coupled to a comparator 21 in series, and bypass capacitors C1 and C2 which couple coupling nodes between the comparator 21 and the resistors R1 and R2 to the ground. The comparator 21 receives DC components extracted from the input signals, for example, common modes. The comparator 21 compares the degrees of the DC components.

Figure 5:
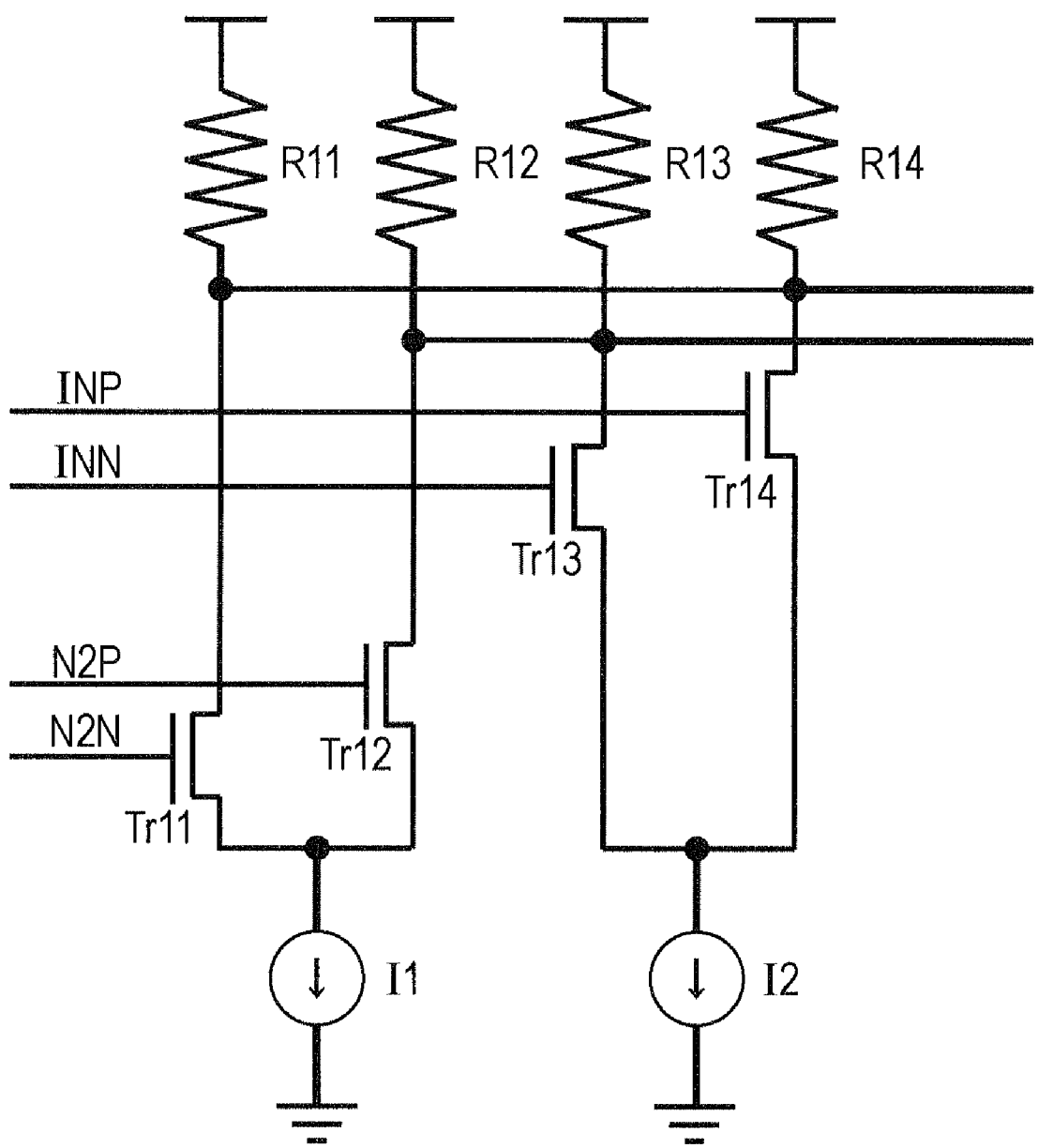
FIG. 5 illustrates an exemplary level shifter circuit.

FIG. 5 illustrates an exemplary level shifter circuit. The level shifter circuit illustrated in FIG. 5 may be the level shifter circuit 11 in FIG. 2. The level shifter circuit 11 includes a differential amplifier circuit, and a differential amplifier containing a configuration substantially equivalent to, or similar to, a configuration of the differential amplifier circuit. The differential amplifier may use a smaller transistor, or a smaller resistor, than a transistor, or a resistor, of the differential amplifier circuit.

The level shifter circuit includes an n-channel metal-oxide semiconductor (NMOS) transistor Tr11 and a resistor R11 which are serially coupled to a current source I1 coupled to the ground; a NMOS transistor Tr12 and a resistor R12 which are serially coupled to the current source I1; a NMOS transistor Tr13 and a resistor R13 serially coupled to a current source I2 coupled to the ground; and a NMOS transistor Tr14 and a resistor R14 serially coupled to the current source I2. Input signals INP and INN are input to gates of the NMOS transistors Tr13 and Tr14. Output signals N2P and N2N of the common mode comparator circuit 13 are input to gates of the NMOS transistors Tr11 and Tr12. A coupling node between the resistor R11 and the NMOS transistor Tr11 and a coupling node between the resistor R14 and the NMOS transistor Tr14 provide an output of the level shifter circuit. Also, a coupling node between the resistor R12 and the NMOS transistor Tr12 and a coupling node between the resistor R13 and the NMOS transistor Tr13 provide an output of the level shifter circuit.

The output of the level shifter circuit illustrated in FIG. 5 is a node of the coupling node between the transistor Tr11 and the resistor R11 and the coupling node between the transistor Tr14 and the resistor R14. Hence, when offset is controlled with the signal N2P, a level-shifted signal INP is output. The output of the level shifter circuit illustrated in FIG. 5 is a node of the coupling node between the transistor Tr12 and the resistor R12 and the coupling node between the transistor Tr13 and the resistor R13. Hence, when offset is controlled with the signal N2N, a level-shifted signal INN is output.

Figure 6:
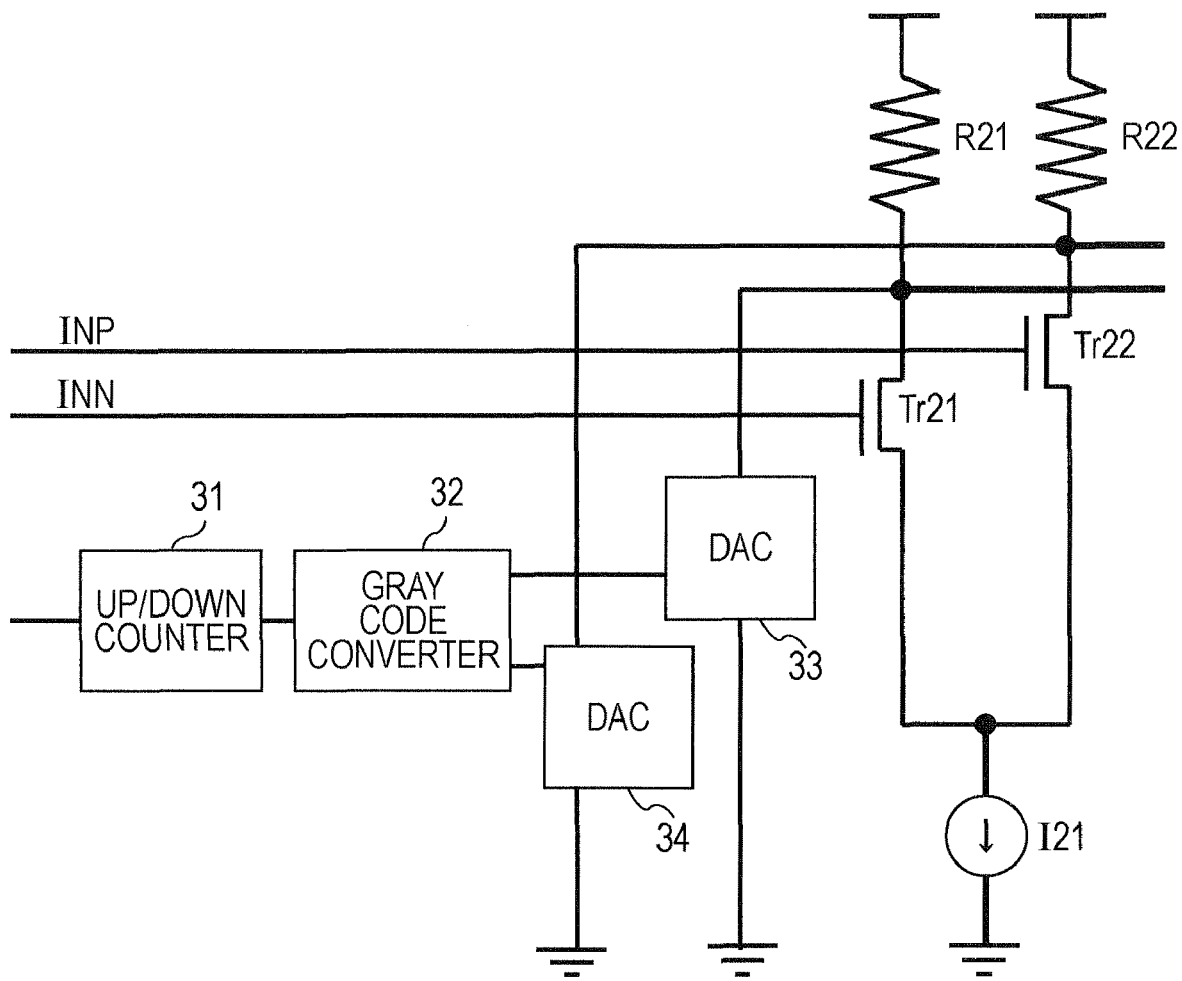
FIG. 6 illustrates an exemplary level shifter circuit.

FIG. 6 illustrates an exemplary level shifter circuit. The level shifter circuit illustrated in FIG. 6 may be the level shifter circuit 11 in FIG. 2. The signal N2P from the common mode comparator circuit 13 is input to the level shifter circuit 11. The level shifter circuit includes an up/down counter 31 for outputting an up signal when the input signal N2P is '1' and outputting a down signal when the input signal N2P is '0', and digital to analog (D/A) converters (DACs) 33 and 34 for converting an output of the up/down counter 31 into a current value. NMOS transistors Tr21 and Tr22 are provided in parallel to the D/A converters 33 and 34. The NMOS transistors Tr21 and Tr22 perform duty correction. Signals INP and INN are input to the NMOS transistors Tr21 and Tr22. A differential amplifier circuit includes the NMOS transistors Tr21 and Tr22, resistors R21 and R22 which are serially coupled to the NMOS transistors Tr21 and Tr22, and a current source I21.

A feedback correction value in the level shifter circuit illustrated in FIG. 6 is binary digital data. A gray code converter 32 is provided between the up/down counter 31 and the D/A converters 33 and 34. To change the signal bit by bit, the gray code converter 32 converts binary number data output from the up/down counter 31 into a gray code.

In the level shifter circuit, the up/down counter 31 counts a feedback signal from the common mode comparator circuit 13, and the gray code converter 32 converts a count value into a gray code. Based on the gray code, the D/A converters 33 and 34 generate signals that change offsets of the input signals INP and INN. By aligning the offsets of the input signals INP and INN with the outputs of the D/A converters 33 and 34, the level shifter circuit controls levels of the input signals INP and INN.

Figure 7:
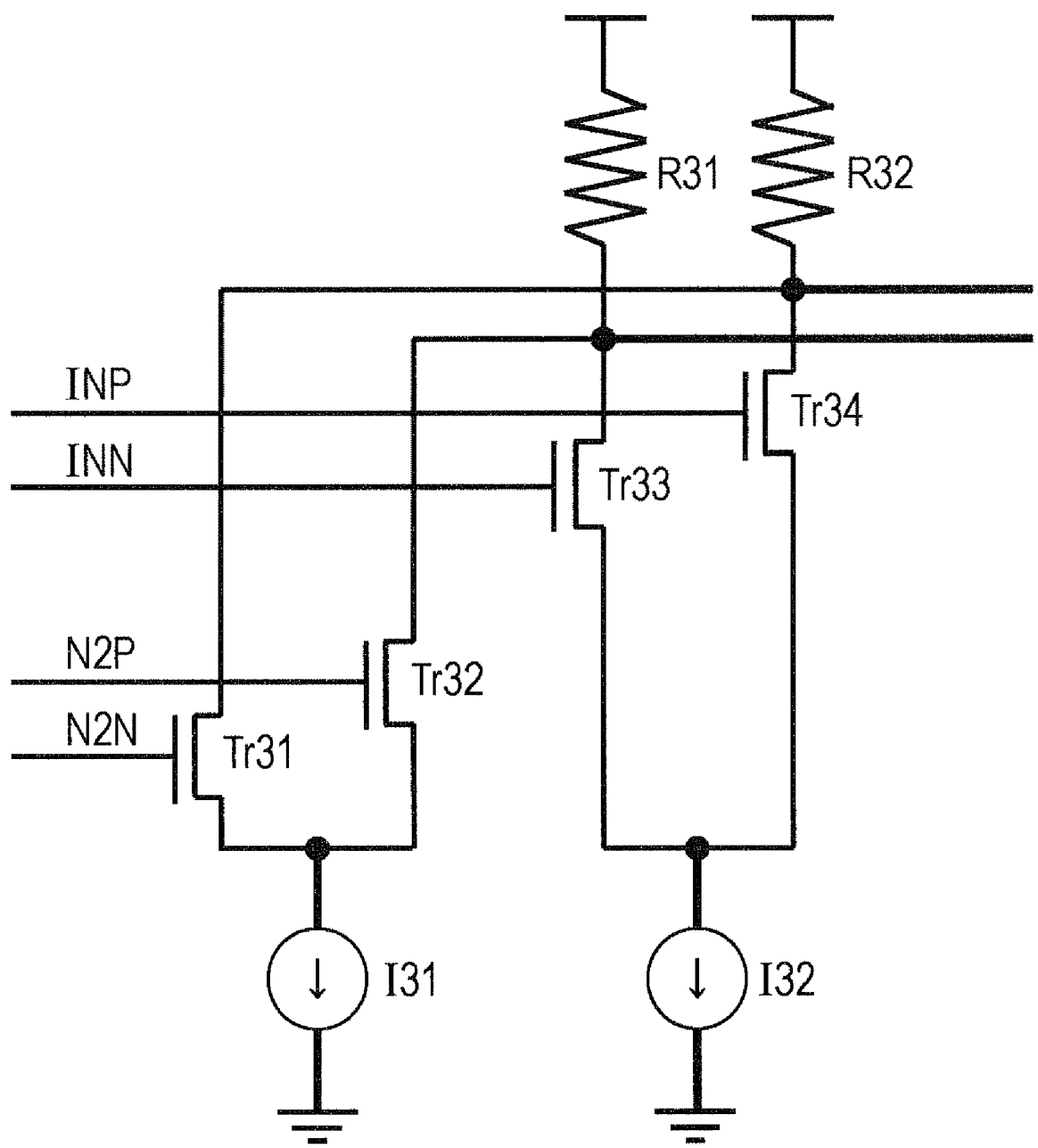
FIG. 7 illustrates an exemplary level shifter circuit.

FIG. 7 illustrates an exemplary level shifter circuit. The level shifter circuit illustrated in FIG. 7 may be the level shifter circuit 11 in FIG. 2. In the level shifter circuit illustrated in FIG. 7, the number of components decreases because two differential amplifier circuits share resistors.

A differential amplifier circuit including NMOS transistors Tr31 and Tr32 and a current source I31, and a differential amplifier circuit including NMOS transistors Tr33 and Tr34 and a current source I32, share resistors R31 and R32.

Figure 8:
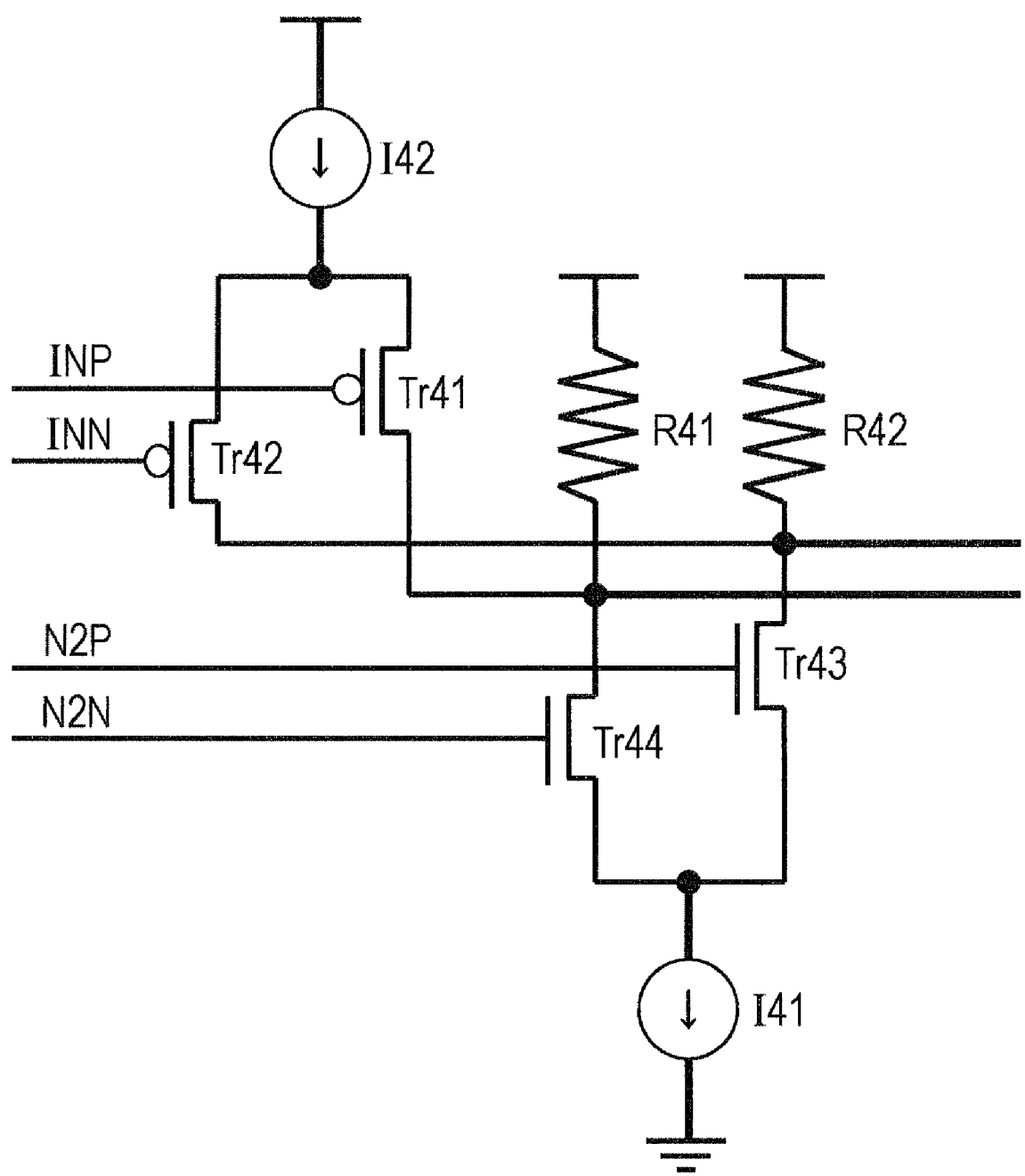
FIG. 8 illustrates an exemplary level shifter circuit.

FIG. 8 illustrates an exemplary level shifter circuit. The level shifter circuit illustrated in FIG. 8 may be the level shifter circuit 11 in FIG. 2. Two differential amplifier circuits share resistors R41 and R42. Transistors Tr41 and Tr42 to which signals INP and INN are input for duty correction may be p-channel metal-oxide semiconductor (PMOS) transistors. Transistors Tr43 and Tr44 to which feedback signals N2P and N2N are input from the common mode comparator circuit 13 may be NMOS transistors. A current source I42 is provided at the pull-up side of the PMOS transistors Tr41 and Tr42. A current source I41 is provided at the ground side of the NMOS transistors Tr43 and Tr44.

An operation of the level shifter circuit illustrated in one of FIGS. 7 and 8 may be substantially equivalent to, or similar to, the operation of the level shifter circuit illustrated in FIG. 5. In the level shifter circuit illustrated in one of FIGS. 7 and 8, the number of components decreases, and the cost decreases.

Figure 9:
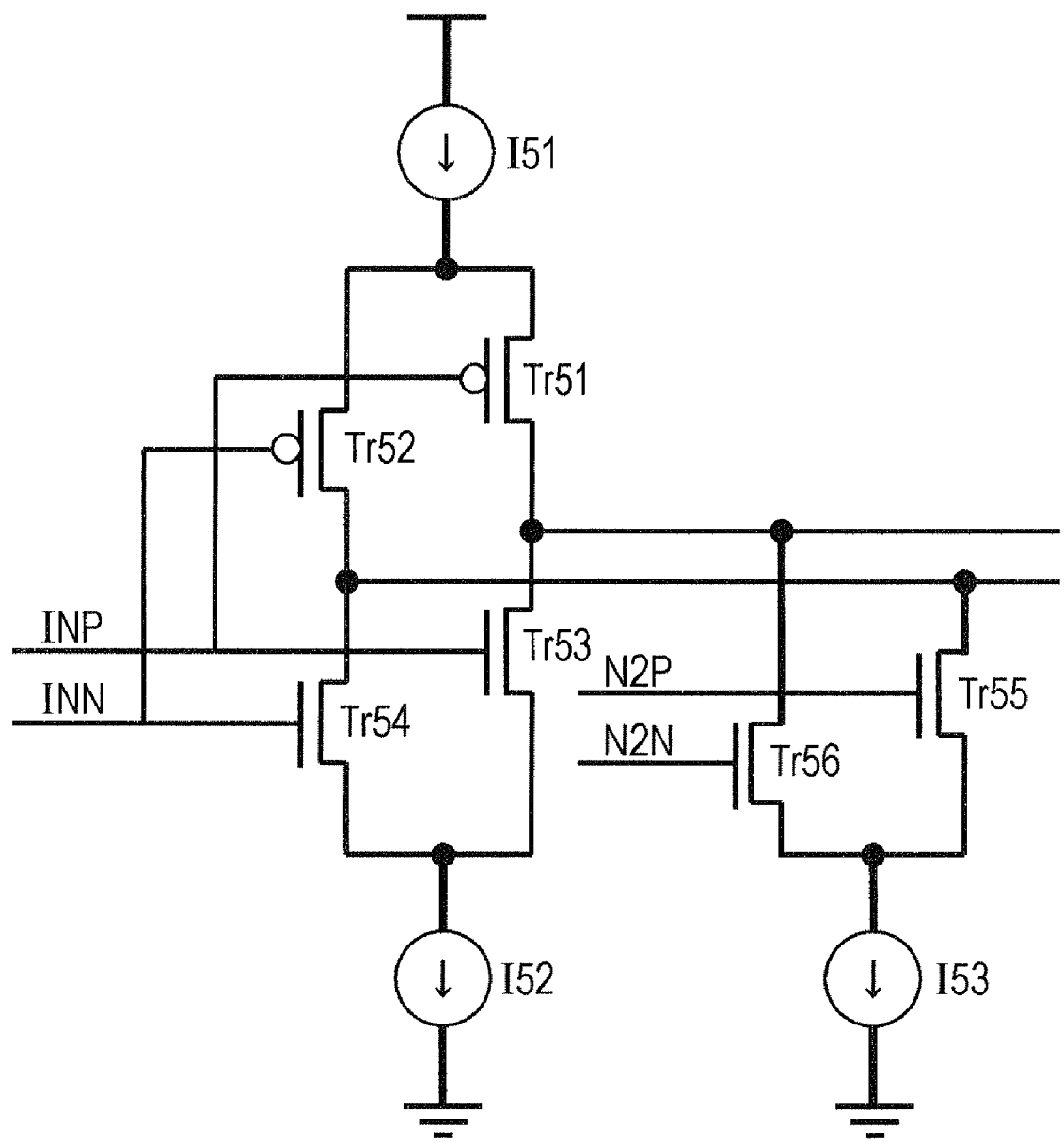
FIG. 9 illustrates an exemplary level shifter circuit.

FIG. 9 illustrates an exemplary level shifter circuit. The level shifter circuit illustrated in FIG. 9 may be the level shifter circuit 11 in FIG. 2. The level shifter circuit illustrated in FIG. 9 includes a differential amplifier circuit of low-voltage differential signaling (LVDS) type for duty correction at the input side of signals INP and INN.

The level shifter circuit illustrated in FIG. 9 includes a PMOS transistor Tr51 and a NMOS transistor Tr53 to which signals INP are input; a PMOS transistor Tr52 and a NMOS transistor Tr54 to which signals INN are input; a current source I51 for PMOS transistors; and a current source I52 for NMOS transistors. Feedback signals N2P and N2N from the common mode comparator circuit 13 are respectively input to NMOS transistors Tr55 and Tr56. The level shifter circuit includes a current source I53 for NMOS transistors.

Figure 10:
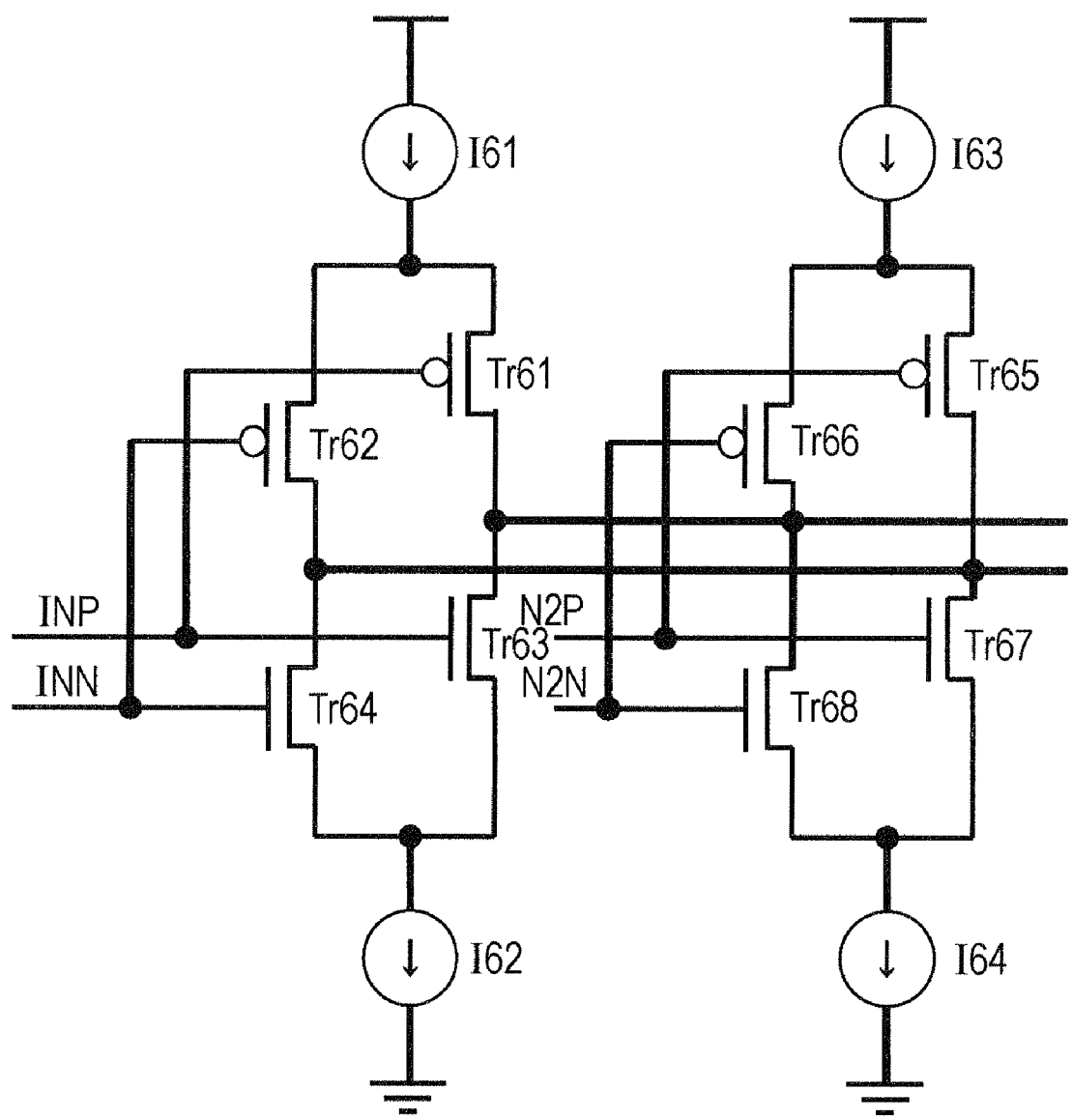
FIG. 10 illustrates an exemplary level shifter circuit.

FIG. 10 illustrates an exemplary level shifter circuit. The level shifter circuit illustrated in FIG. 10 may be the level shifter circuit 11 in FIG. 2. The level shifter circuit illustrated in FIG. 10 includes a differential amplifier circuit of LVDS type to which signals INP and INN for duty correction are input; and a differential amplifier circuit of LVDS type to which feedback signals N2P and N2N from the common mode comparator circuit 13 are input.

The level shifter circuit includes a PMOS transistor Tr61 and a NMOS transistor Tr63 to which signals INP are input; a PMOS transistor Tr62 and a NMOS transistor Tr64 to which signals INN are input; a current source I61 for PMOS transistors; and a current source I62 for NMOS transistors. The level shifter circuit includes a PMOS transistor Tr65 and a NMOS transistor Tr67 to which feedback signals N2P are input; a PMOS transistor Tr66 and a NMOS transistor Tr68 to which feedback signals N2N are input; a current source I63 for PMOS transistors; and a current source I64 for NMOS transistors.

In the level shifter circuit illustrated in one of FIGS. 9 and 10, LVDS part of the level shifter circuit is driven with a voltage. An operation of the level shifter circuit illustrated in one of FIGS. 9 and 10 may be substantially equivalent to, or similar to, the operation of the level shifter circuit illustrated in FIG. 5.

In the level shifter circuit illustrated in one of FIGS. 9 and 10, a flowing amount of current decreases, and as such current consumption decreases.

Figure 11A:
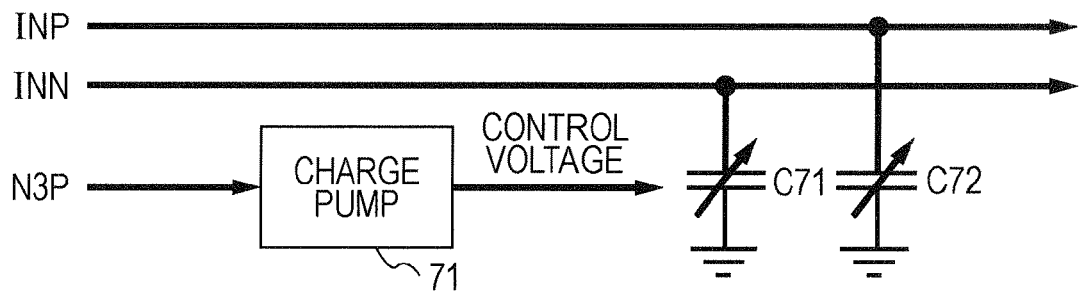
FIGS. 11A, 11B and 11C illustrate an exemplary TrTf control circuit.

FIG. 11 illustrates an exemplary TrTf control circuit. The TrTf control circuit illustrated in FIG. 11 may be the TrTf control circuit 12 in FIG. 2. A TrTf control circuit illustrated in FIG. 11A includes variable capacitors C71 and C72 respectively between signal lines for input signals INP and INN and the ground. Capacitances of the variable capacitors C71 and C72 are controlled based on a control voltage, which is generated by amplifying a feedback signal N3P of the loop 2 of the common mode comparator circuit 15 with a charge pump 71. The capacitances for the signals INP and INN are changed, and hence the edge angles of the signals INP and INN are changed, thereby controlling Tr and Tf.

Figure 11B:
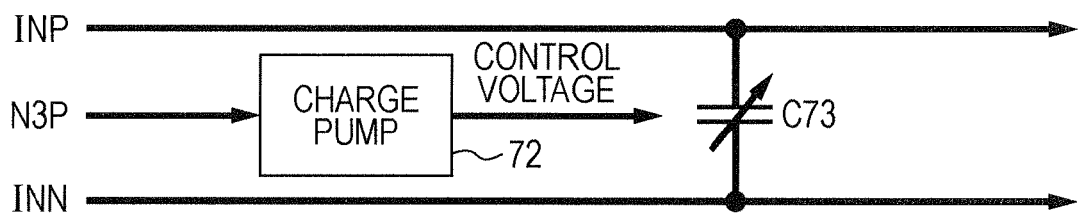

A TrTf control circuit illustrated in FIG. 11B includes a variable capacitor C73 between a signal line for signals INP and a signal line for signals INN.

A capacitance of the variable capacitor C73 is controlled based on a control voltage, which is generated by amplifying a feedback signal N3P of the loop 2 of the common mode comparator circuit 15 with a charge pump 72. Accordingly, inclinations of waveforms of signals INP and INN are controlled.

Figure 11C:
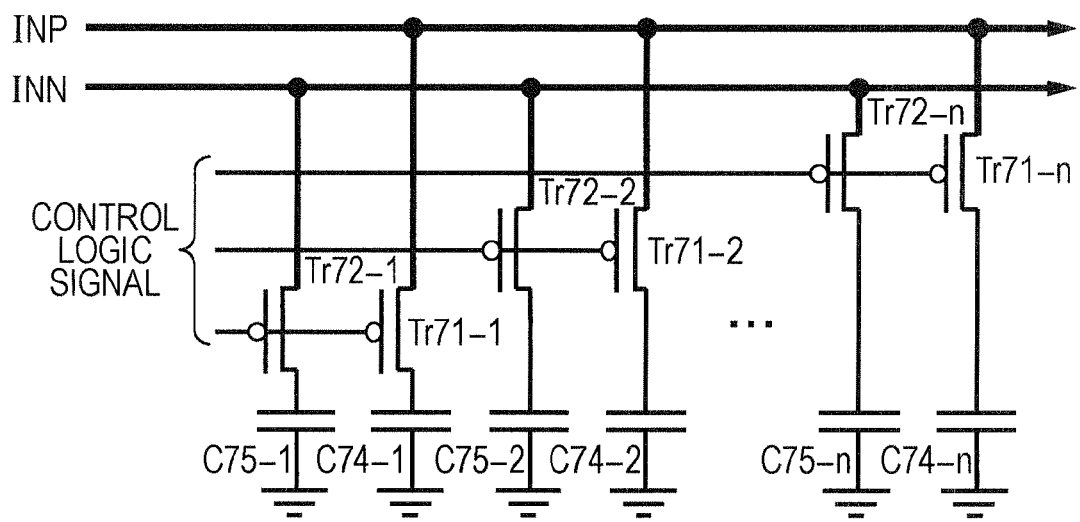

A TrTf control circuit illustrated in FIG. 11C includes capacitors C74-1 to C74-n, which are provided between a signal line for signals INP and the ground respectively through switching transistors Tr71-1 to Tr71-n. The TrTf control circuit illustrated in FIG. 11C includes capacitors C75-1 to C75-n, which are provided between a signal line for signals INN and the ground respectively through switching transistors Tr72-1 to Tr72-n. Control signals are applied to gates of the switching transistors Tr71-1 to Tr71-n and gates of the switching transistors Tr72-1 to Tr72-n. The control signals are generated based on a feedback signal N3P of the loop 2 of the common mode comparator circuit 15. The number of the capacitors C74 and C75 to be coupled to the signal lines for signals INP and INN is changed based on the feedback signal N3P of the loop 2, thereby controlling the edge angles of the signals INP and INN.

FIG. 12 illustrates an exemplary waveform shaping circuit. The waveform shaping circuit illustrated in FIG. 12 may be the waveform shaping circuit 14 in FIG. 2. The waveform shaping circuit 14 performs shaping such that amplitudes of signals N1P and N1N to be input are aligned with each other. For example, the waveform shaping circuit 14 may include a configuration substantially equivalent, to or similar, to a configuration of a differential amplifier circuit.

Figure 12A:
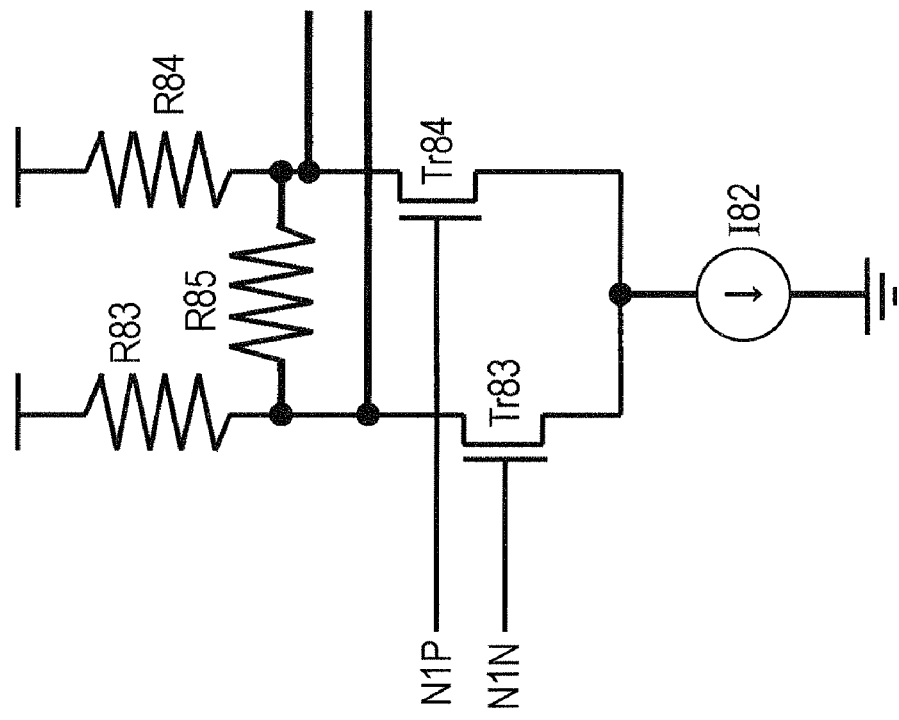
FIGS. 12A and 12B illustrate an exemplary waveform shaping circuit.

In a waveform shaping circuit illustrated in FIG. 12A, a current source I81, a NMOS transistor Tr81, and a resistor R81 are serially coupled. The current source I81 is serially coupled to a NMOS transistor Tr82 and a resistor R82 in a manner parallel to the NMOS transistor Tr81 and the resistor R81.

Figure 12B:
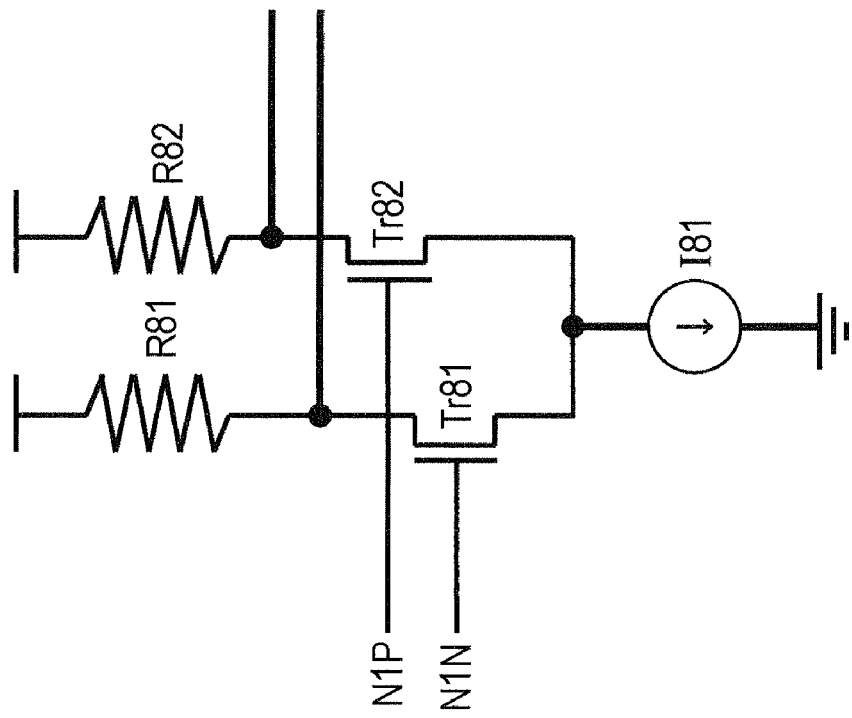

In a waveform shaping circuit illustrated in FIG. 12B, a current source I82 is serially coupled to a NMOS transistor Tr83 and a resistor R83, and is serially coupled to a NMOS transistor Tr84 and a resistor R84. The NMOS transistor Tr83 and the resistor R83 are provided in parallel to the NMOS transistor Tr84 and the resistor R84. A resistor R85 is provided between the resistors R83 and R84.

The waveform shaping circuit illustrated in FIG. 12B may be used, for example, to decrease gain and increase a band of a signal. In the waveform shaping circuit illustrated in one of FIGS. 12A and 12B, DC amplitudes of output signals are restricted, and hence, part of waveform exceeding the DC amplitudes is removed.

A duty correction circuit of the duty correction circuit illustrated in FIG. 2 controls the common modes of the input signals in the loop 1, and controls the edge angles of the input signals in the loop 2. Accordingly, duty correction is performed regardless of a frequency, or a duty ratio of input signals, a temperature, a supply voltage, or a process.

Figure 13:
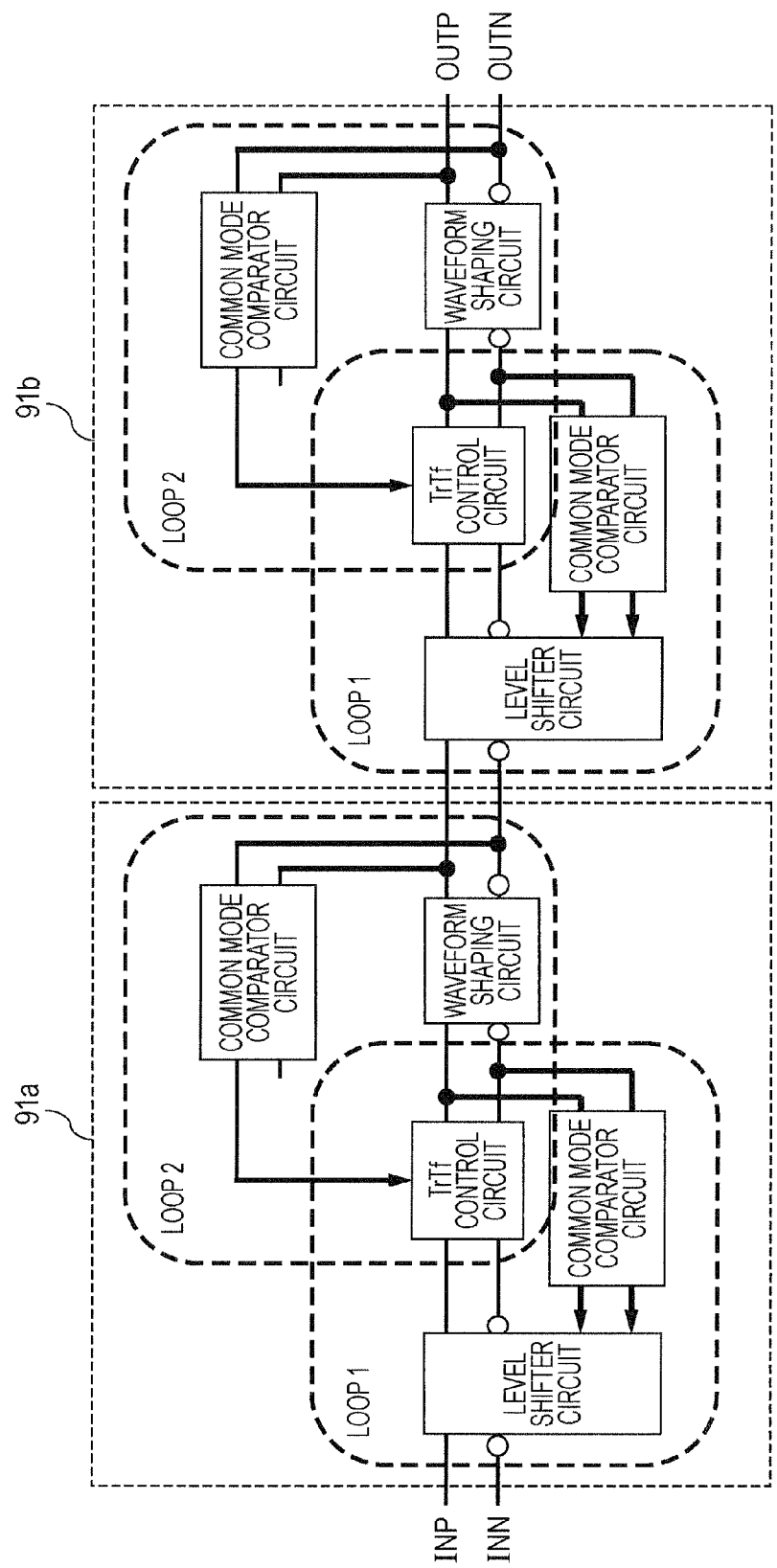
FIG. 13 illustrates an exemplary duty correction circuit.

FIG. 13 illustrates an exemplary duty correction circuit. In the duty correction circuit illustrated in FIG. 13, two duty correction circuits are coupled by cascade connection. Since duty correction circuits 91a and 91b are coupled by cascade connection, the effect of duty correction may be enhanced.

The upstream duty correction circuit 91a performs duty correction for input signals INP and INN. Outputs of the duty correction circuit 91a are input to the duty correction circuit 91b. The downstream duty correction circuit 91b performs duty correction for the outputs of the duty correction circuit 91a. In the duty correction circuit illustrated in FIG. 13, highly accurate duty correction may be performed.

Examples of the present invention have now been described in accordance with the above advantages. It will be appreciated that these examples are merely illustrative of the invention. Many variations and modifications will be apparent to those skilled in the art.

Moreover, the term "or" is intended to mean an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form.

The invention claimed is:

1. A duty correction circuit comprising:
   a level shifter configured to receive complementary differential input signals having a duty ratio and controls levels of the differential input signals;
   a rise time fall time (TrTf) control circuit configured to receive output signals of the level shifter and controls edge angles of the output signals;
   a waveform shaping circuit configured to receive output signals of the TrTf control circuit and shapes waveforms of the output signals;
   a first common mode comparator configured to extract common modes of the output signals of the TrTf control circuit and compares the common modes with each other; and
   a second common mode comparator configured to extract common modes of output signals of the waveform shaping circuit and compares the common modes with each other,
   wherein the level shifter controls the levels based on outputs of the first common mode comparator, and
   wherein the TrTf control circuit controls the edge angles based on outputs of the second common mode comparator.

2. The duty correction circuit according to claim 1, wherein the level shifter includes two pairs of differential amplifier circuits arranged in parallel.

3. The duty correction circuit according to claim 2, wherein one of the two pairs of differential amplifier circuits includes a circuit having a size equivalent to or smaller than a size of a circuit included in the other of the two pairs of differential amplifier circuits.

4. The duty correction circuit according to claim 2, wherein the two pairs of differential amplifier circuits share a pair of resistors.

5. The duty correction circuit according to claim 2, at least one of the two pairs of differential amplifier circuits includes,
   an up/down counter,
   a gray code converter, and
   a digital to analog converter.

6. The duty correction circuit according to claim 2, wherein one of the two pairs of differential amplifier circuits includes a differential amplifier circuit having a PMOS transistor, and the other of the two pairs of differential amplifier circuits includes a differential amplifier circuit having a PMOS transistor.

7. The duty correction circuit according to claim 2, wherein at least one of the two pairs of differential amplifier circuits includes a differential amplifier circuit of low-voltage differential signaling (LVDS) type.

8. The duty correction circuit according to claim 1, wherein the first common mode comparator and the second common mode comparator include,
   a comparator, and
   a low pass filter.

9. The duty correction circuit according to claim 1, wherein the TrTf control circuit changes capacitances for the output signals of the level shifter based on the outputs of the second common mode comparator.

10. The duty correction circuit according to claim 9, wherein the TrTf control circuit includes a variable capacitor coupled to a signal line for the output signals of the level shifter, and
    wherein the TrTf control circuit changes a capacitance of the variable capacitor based on the outputs of the second common mode comparator.

11. The duty correction circuit according to claim 9, wherein the TrTf control circuit includes,
    a plurality of capacitors coupled to signal lines for the output signals of the level shifter,
    a plurality of switching transistors, provided respectively for the capacitors, which switch respective connections between the capacitors and the signal lines, and wherein the switching transistors are controlled based on the outputs of the second common mode comparator.

12. The duty correction circuit according to claim 1, wherein the waveform shaping circuit includes a differential amplifier circuit.

13. A duty correction system comprising:
a first duty correction circuit and a second duty correction circuit which are coupled by cascade connection,
wherein the first duty correction circuit and the second duty correction circuit each include,
  a level shifter which receives complementary differential input signals having a duty ratio and controls levels of the differential input signals;
  a raise time fall time (TrTf) control circuit configured to receive output signals of the level shifter and controls edge angles of the output signals;
  a waveform shaping circuit configured to receive output signals of the TrTf control circuit and shapes waveforms of the output signals;
  a first common mode comparator configured to extract common modes of the output signals of the TrTf control circuit and compares the common modes with each other; and
  a second common mode comparator configured to extract common modes of output signals of the waveform shaping circuit and compares the common modes with each other,
wherein the level shifter controls the levels based on outputs of the first common mode comparator, and
wherein the TrTf control unit controls the edge angles based on outputs of the second common mode comparator.

14. A duty correction method comprising:
inputting complementary differential input signals having a desirable duty ratio;
controlling levels of the differential input signals;
controlling edge angles of the differential input signals the levels of which is controlled;
shaping waveforms of the differential input signals the edge angles of which is controlled;
comparing common modes of the differential input signals the edge angles of which is controlled; and
comparing common modes of the differential input signals with each other, the waveforms of the differential input signals shaped,
wherein the controlling levels is performed in accordance with the comparison result of the differential input signals the edge angles of which is controlled, and
wherein the controlling edge angles is performed in accordance with the comparison result the differential input signals the waveforms of which is shaped.

* * * * *